United States Patent
Satou et al.

(10) Patent No.: US 6,838,638 B2
(45) Date of Patent: Jan. 4, 2005

(54) LASER BEAM MACHINING METHOD

(75) Inventors: Akio Satou, Toyota (JP); Kazuhisa Mikame, Toyota (JP)

(73) Assignee: Toyota Jidosha Kabushiki Kaisha, Toyota (JP)

(*) Notice: Subject to any disclaimer, the term of this patent is extended or adjusted under 35 U.S.C. 154(b) by 0 days.

(21) Appl. No.: 10/089,443

(22) PCT Filed: Jul. 16, 2001

(86) PCT No.: PCT/JP01/06131
§ 371 (c)(1),
(2), (4) Date: Mar. 29, 2002

(87) PCT Pub. No.: WO02/09904
PCT Pub. Date: Feb. 7, 2002

(65) Prior Publication Data
US 2002/0148818 A1  Oct. 17, 2002

(30) Foreign Application Priority Data
Jul. 31, 2000  (JP) ........................ 2000-231182

(51) Int. Cl.$^7$ ............................................. B23K 26/06
(52) U.S. Cl. ................................................ 219/121.73
(58) Field of Search .................. 148/512, 565; 359/639, 640; 219/121.63, 121.64, 121.6, 121.85, 121.73, 121.75, 601, 607

(56) References Cited

U.S. PATENT DOCUMENTS 5,886,313 A  *  3/1999  Krause et al. ........... 219/121.6

* cited by examiner

*Primary Examiner*—Kiley Stoner
*Assistant Examiner*—Jonathan Johnson
(74) *Attorney, Agent, or Firm*—Kenyon & Kenyon

(57) ABSTRACT

A method of laser beam machining which has a simple construction and which is capable of suitably processing a part to be processed by means of laser beams is provided. A plurality of laser diode arrays 3 are stacked and disposed in such a manner as to allow radiation of laser beams in the direction of a width W of a part 1 to be processed. Each of the laser diode arrays 3 is controlled such that outputs 2R, 2L of laser beams with which the part 1 to be processed is irradiated in its width (W)-wise marginal portions 1R, 1L become higher than an output 2C of laser beams with which the part 1 to be processed is irradiated in its width (W)-wise central portion 1C. While the part 1 to be processed is irradiated with the laser beams with the distribution of energy thus changed, the laser beams are displaced relatively in the longitudinal direction of the part 1 to be processed.

3 Claims, 10 Drawing Sheets

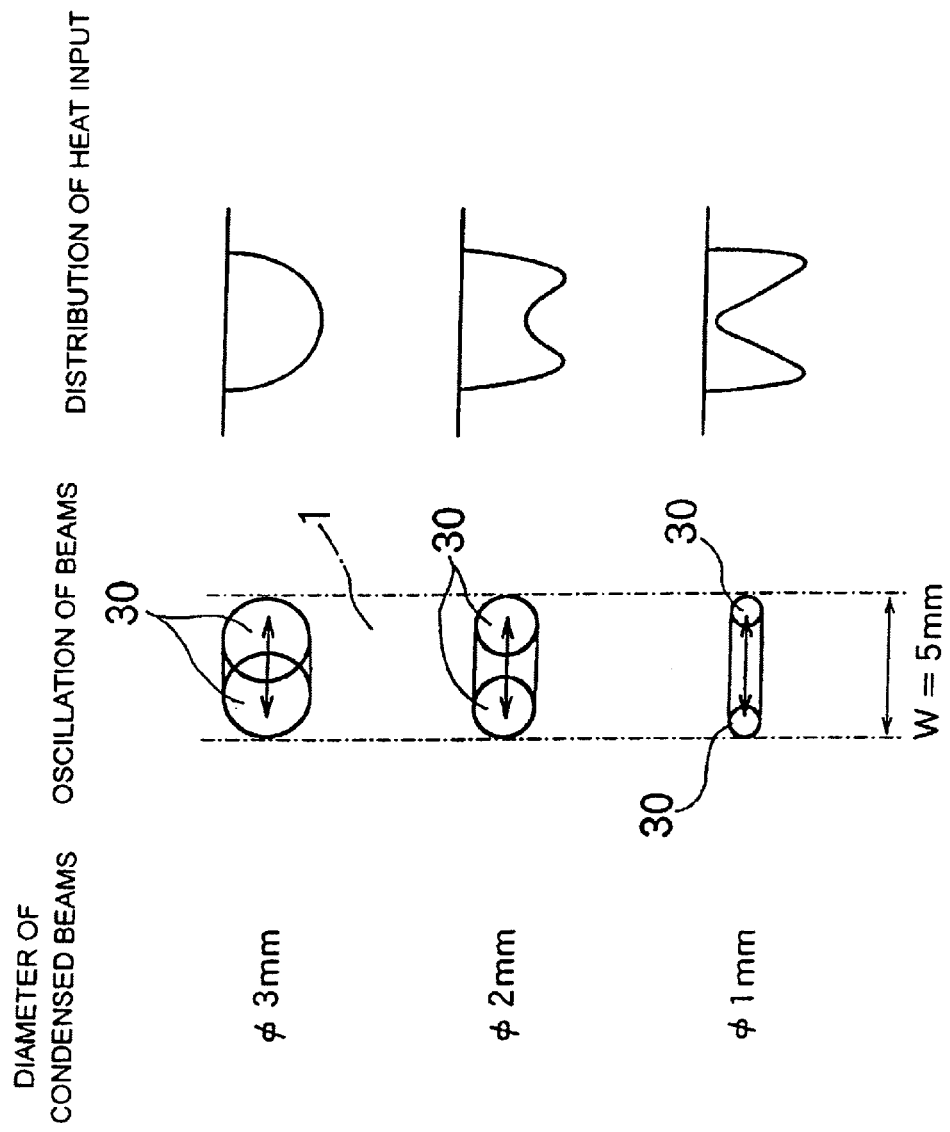

LASER BEAM MACHINING METHOD

TECHNICAL FIELD

The present invention relates to a method of laser beam machining, and more particularly to a method of subjecting a part to be processed to a predetermined processing such as padding, welding, or hardening through radiation of laser beams.

BACKGROUND ART

For example, if a part to be processed is subjected to padding by means of laser beams (laser cladding) to form a cladding layer, it is customary that a powdery cladding material be applied to or deposited on the surface of a base material and that the cladding material be irradiated with laser beams. The laser beams that have been radiated are multiplicatively reflected in the cladding material and are thereby absorbed while being attenuated, thus heating the cladding material and welding it to the base material. It is to be noted herein that the distribution of energy of generally employed laser beams with which a part to be processed is irradiated is either defocused and adapted for Gaussian mode (single mode) or adapted for multiple mode so as to ensure that the laser beams exhibit an intensity of a predetermined level continuously over a certain width (although it is in fact difficult to maintain the intensity of the laser beams at the predetermined level).

As a more concrete example of performing padding by means of such laser beams, it is known to supply a wear-resistant and corrosion-resistant cladding material that is different from a material for an intake or exhaust valve body of an engine or its valve seat portion (base material) to the surface of the base material through a nozzle or the like with a view to enhancing the wear resistance and corrosion resistance of the valve body or the valve seat portion, irradiate the cladding material with laser beams, weld the cladding material to the valve body or the valve seat portion (base material), and clad it with a cladding layer.

One of the arts applicable to such an example is disclosed in Japanese Patent Application Laid-Open No. HEI 9-239574 as a method of manufacturing an engine valve. This publication mentions "that a method of manufacturing an engine valve (by cladding it with a cladding layer through radiation of laser beams) requires uniformly heating a powdery material for padding (cladding material) over the entire region in the radial direction of a valve body and that if a base material is for example heated partially and excessively, the phenomenon of dilution, namely, penetration of constituents of the base material through a padding material occurs as a result of fusion of the base material and makes it impossible for the padding material (cladding material) to exhibit its inherent properties such as wear resistance or causes inconveniences such as incomplete welding, underfill, fusion sag, and the like of the padding material" (see paragraph 0003 of this publication).

As a problem to be solved, this publication mentions "that the base material of the valve body at the beginning of padding is at a room temperature, that the heat of laser beams is conveyed to the base material at a position to be padded later as the operation of padding based on radiation of laser beams proceeds, that the later the base material is padded at a certain position, the higher the temperature of the base material at the position becomes, and that the temperature of the base material almost at the end of padding is higher than the temperature of the base material at the beginning of padding" (see paragraph 0005 of this publication). As a means for solving the problem, Japanese Patent Application Laid-Open No. HEI 9-239574 discloses "a method of manufacturing an engine valve wherein a groove portion is formed in a valve body in its region that serves as a valve face and wherein laser beams are displaced relatively in the circumferential direction of the groove portion so as to perform padding while the powdery material for padding that has been supplied to the groove portion is being irradiated on the surface of its powder layer with the laser beams, characterized in that distribution of output energy of the laser beams is controlled such that a marginal portion at the time of each padding operation is maintained at a substantially constant temperature from the beginning of padding to the end of padding" and "a method of manufacturing an engine valve wherein a groove portion is formed in a valve body in its region that serves as a valve face and wherein laser beams are displaced relatively in the circumferential direction of the groove portion so as to perform padding while the powdery material for padding that has been supplied to the groove portion is being irradiated on the surface of its powder layer with the laser beams, characterized in that the surface of a powder layer is irradiated with the laser beams whose spot diameter has been narrowed down to a value smaller than the width of the groove portion, that the laser beams having the spot diameter thus narrowed down are oscillated in the radial direction of the valve, and that the width of oscillation is reduced after padding has been started".

Furthermore, as an effect of the construction as described above, this publication mentions "that since the marginal portion of each padding position can be maintained at a suitable temperature from the beginning of padding to the end of padding, it is possible to inhibit the padding material from decreasing in wear resistance or corrosion resistance or from undergoing incomplete welding or underfill due to dilution of the base material in the marginal portion that has a low heat capacity, perform padding uniformly and with good quality over the entire region, and provide a high-quality engine valve" (see paragraph 0035 of this publication).

As is also shown in FIG. 12, a device for performing padding by means of laser beams thus narrowed down (adapted for Gaussian mode) comprises a parabolic mirror 31 for condensing oscillated laser beams, an oscillating mirror 32 for oscillating laser beams 30 that have been condensed and adapted for Gaussian mode in accordance with a width W of a cladding material 1 that has been deposited on the surface of a base material 5 as a part to be processed, and a driving means (not shown) for driving the oscillating mirror 32 in a fluctuating and reciprocating manner, such as a galvanometer or the like. Furthermore, in general, a nozzle 7 for supplying shielding gas to the cladding material 1 around its region irradiated with laser beams is provided.

In the case where a valve seat or the like is thus subjected to a predetermined processing such as padding or the like by means of the laser beams 30 that have been adapted for Gaussian mode, it has been customary to displace the laser beams 30 relatively in the longitudinal direction (or in the circumferential direction) of the part 1 to be processed while oscillating them in the direction of the width W (or in the radial direction) of the part 1 to be processed.

However, as described above, in the case where padding is performed by means of laser beams, laser beams that have been radiated are multiplicatively reflected by a cladding material and absorbed while being attenuated, whereby the cladding material is heated and welded to a base material. Hence, if the cladding material that has been deposited with different thicknesses is irradiated with laser beams of the same intensity, it exhibits a higher degree of multiplicative reflection of laser beams and thus absorbs a greater amount of the radiated laser beams in its region that has been deposited to a great thickness. Thus, as compared with the region that has been deposited to a small thickness, the region that has been deposited to a great thickness exhibits a higher degree of distribution of heat input and is more likely to be heated. On the other hand, the cladding material that has been supplied to and deposited on the surface of the base material by means of a nozzle or the like is generally thick in its widthwise central portion and thin in its widthwise marginal portions. Accordingly, in the case of irradiating the cladding material that has been supplied to the surface of the base material from the nozzle with laser beams of a uniform intensity, the cladding material is heated excessively in its widthwise central portion that has been deposited to a great thickness so that dilution of the base material tends to occur, and the cladding material is heated insufficiently in its widthwise marginal portions that have been deposited to a small thickness so that incomplete welding tends to occur.

The conventional art disclosed in the aforementioned Japanese Patent Application Laid-Open No. HEI 9-239574 takes into account the fact that the heat of laser beams during the operation of padding is conveyed to the base material at its position to be padded later so that the base material rises in temperature, and is designed to adjust the distribution of output energy in the processing (longitudinal) direction of the laser beams such that the marginal portion of the engine valve to be padded is maintained at a substantially constant temperature from the beginning of padding to the end of padding. This conventional art does not consider the difference in distribution of heat input in the direction of the width of the cladding material.

Further, as described above, this publication mentions that the art disclosed therein requires uniformly heating the entire region in the direction of the width of the cladding material. For this purpose, laser beams are oscillated with respect to the cladding material in the radial direction (the direction of the width) of the valve. Therefore, a cladding layer 1' is formed with an undulant surface or meandrous marginal portions 1e'. The problem is that the cladding layer 1' cannot be formed smoothly. In the case where a valve body or a valve seat is subjected to laser cladding, the surface of a cladding material that has been formed to ensure sealing properties during abutment of the valve body on the valve seat is ground or subjected to other processings. However, if the cladding layer 1' is formed with an undulant surface or meandrous marginal portions, the amount of the cladding layer 1' to be ground or subjected to other processings is increased. The problems are that the method becomes time-consuming and laborious and that a certain amount of the cladding material 1 is wasted.

Furthermore, in the case where the laser beams 30 that have been adapted for Gaussian mode are oscillated within a predetermined width of the part to be processed, there is a problem of dependency of the distribution of heat input on the diameter of the condensed laser beams 30. That is, as shown in FIG. 13, it is assumed for example that the part to be processed has the width W of 5 mm and that the condensed beams 30 have a diameter of 3 mm, 2 mm or 1 mm. If the condensed beams 30 have a diameter of 3 mm, they overlap with one another at the center in the direction of the width W of the part 1 to be processed, so that the distribution of heat input is biased toward the center in the direction of the width W of the part 1 to be processed. If the condensed beams 30 have a diameter of 2 mm, the part 1 to be processed is irradiated with the beams in its width (W)-wise marginal portions over a longer period than in its width (W)-wise central portion, so that more heat is inputted to the width (W)-wise marginal portions of the part 1 to be processed than to the width (W)-wise central portion of the part 1 to be processed. If the condensed beams 30 have a diameter of 1 mm, the part 1 to be processed is irradiated with the beams in its width (W)-wise marginal portions over a much longer period than in its width (W)-wise central portion, so that the distribution of heat input is biased toward the width (W)-wise marginal portions of the part 1 to be processed and that the amount of heat inputted to the width (W)-wise central portion of the part 1 to be processed is insufficient. That is, the problem is that the distribution of heat input cannot be stabilized. In the case of padding, if the distribution of heat input is biased toward a certain portion, the phenomenon of dilution, namely, penetration of the base material 5 through the cladding material 1' occurs, and it becomes impossible to perform the function of enhancing wear resistance and the like of the valve seat or the like. That is, the problem is that the part to be processed is heated excessively and can no longer be processed as originally intended. Further, in the case of padding, if the intensity of laser beams is lowered with a view to preventing the part to be processed from being heated excessively, the cladding material cannot be welded to the base material. That is, the problem is that the amount of heat inputted to the part to be processed becomes insufficient so that the part to be processed can no longer be processed as originally intended.

In addition, since the device for oscillating laser beams is designed to drive the oscillating mirror 32 in a fluctuating and reciprocating manner, it is complicated in structure and control logics. Another problem is that the maintenance operations for removing dirt from the oscillating mirror 32 etc. are laborious.

On the other hand, in the case where the part to be processed is irradiated with laser beams that have been adapted for multiple mode, in order to maintain the intensity of the laser beams at a predetermined level continuously in the width direction, it is necessary to average the intensity of the laser beams at the predetermined level in the width direction. The problem is that the laser beams decrease in energy efficiency. Another problem is that it is difficult to actually maintain the intensity of the laser beams at the predetermined level. In addition, as is apparent from a comparative example shown on the right side of FIG. 6(a), even in the case of radiating laser beams that have been adapted for multiple mode, the cladding material 1 is heated excessively in its width (W)-wise central portion that has been deposited to a great thickness as described above, so that a corresponding portion of the base material 5 is heated up to the extent of causing dilution (see a comparative example shown in FIG. 6(b)). Further, the cladding material 1 is heated insufficiently in its width (W)-wise marginal portions that have been deposited to a small thickness, so that incomplete welding is caused. As a result, as is apparent from a comparative example shown in FIG. 6(c), the apex of the cladding layer 1' that has been formed is bulgy and biased toward a location which is heated excessively and to which a great amount of heat is inputted. Thus, in the case of padding a valve seat or the like, the cladding layer 1' is not smooth enough to be welded to the base material 5. The problems are that the amount of the cladding layer 1' to be ground later is increased and that the valve seat becomes incapable of performing its inherent function.

Such problems ascribable to the dependency of the distribution of heat input on the position in the direction of the width of the part to be processed occur not only in the case where padding such as laser cladding or the like is performed but also in the case where laser beam welding, laser beam hardening, or the like is performed.

The present invention has been made as a solution to the aforementioned problems. It is an object of the present invention to provide a method of laser beam machining which has a simple construction and which is capable of suitably processing a part to be processed by means of laser beams.

SUMMARY OF INVENTION

In order to achieve the object stated above, the method of laser beam machining according to the present invention as set forth in claim 1 is characterized in that a plurality of laser diode arrays are disposed in such a manner as to allow radiation of laser beams in the direction of a width of a part to be processed and that each of the laser diode arrays is controlled in accordance with the direction of the width of the part to be processed so as to shape laser beams and irradiate the part to be processed with the laser beams.

In order to achieve the object stated above, the method of laser beam machining according to the present invention as set forth in claim 2 is based on the present invention as set forth in claim 1 and is characterized in that each of the laser diode arrays is controlled and laser beams are shaped such that distribution of energy is changed in accordance with a width position of the part to be processed.

In order to achieve the object stated above, the method of laser beam machining according to the present invention as set forth in claim 3 is based on the present invention as set forth in claim 2 and is characterized in that the distribution of energy is changed by controlling each of the laser diode arrays and shaping the laser beams such that laser beams with which the part to be processed is irradiated in its widthwise marginal portions exhibit a higher intensity than laser beams with which the part to be processed is irradiated in its widthwise central portion.

In order to achieve the object stated above, the method of laser beam machining according to the present invention as set forth in claim 4 is based on the present invention as set forth in any one of claims 1 to 3 and is characterized in that laser beam machining is a processing which is selected from padding, welding and hardening and to which the part to be processed is subjected.

According to the present invention as set forth in claim 1, the laser diode arrays are disposed in such a manner as to allow radiation of laser beams in the direction of the width of the part to be processed, and the laser beams are displaced relatively in the longitudinal direction of the part to be processed while being radiated so as to perform a predetermined processing. At this moment, each of the laser diode arrays is controlled to ensure that the laser beams are radiated in a state of being shaped in accordance with the direction of the width of the part to be processed.

The present invention as set forth in claim 2 is based on the present invention as set forth in claim 1 and is designed such that each of the laser diode arrays is controlled and the laser beams are shaped so as to change the distribution of energy in accordance with the width position of the part to be processed.

The present invention as set forth in claim 3 is based on the present invention as set forth in claim 2 and is designed such that each of the laser diode arrays is controlled to change the distribution of energy such that laser beams with which the part to be processed is irradiated in its widthwise marginal portions exhibit a higher intensity than laser beams with which the part to be processed is irradiated in its widthwise central portion. Thereby, the part to be processed is uniformly and suitably processed in its widthwise marginal portions that cannot be processed easily and in its widthwise central portion that can be processed easily.

The present invention as set forth in claim 4 is based on the present invention as set forth in any one of claims 1 to 3 and is designed such that the laser beams are radiated in a state of being shaped in accordance with the direction of the width of the part to be processed so as to optimally perform the processing that has been selected from padding, welding and hardening.

BRIEF DESCRIPTION OF DRAWINGS

FIG. 13 is an explanatory view showing how the distribution of heat input changes depending on the diameter of condensed laser beams in the conventional laser beam machining device in which laser beams are oscillated.

DETAILED DESCRIPTION

Figure 1:
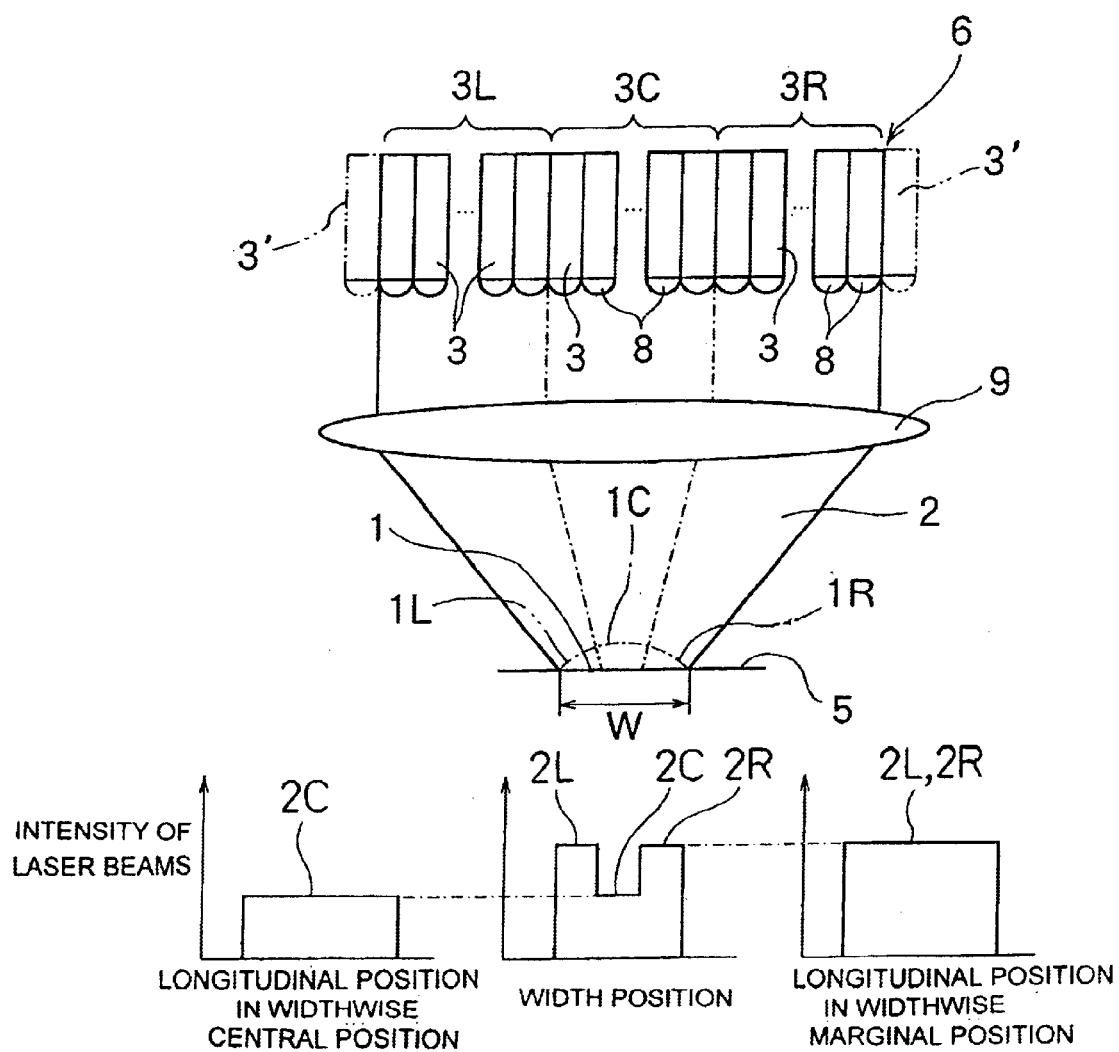
FIG. 1 is an explanatory view showing one embodiment of the present invention.

Hereinafter, a method of laser beam machining according to one embodiment of the present invention in the case of padding will be described in detail with reference to FIGS. 1 to 6. It is to be noted herein that like reference symbols denote like or corresponding elements.

The method of laser beam machining according to the present invention is generally designed such that a plurality of laser diode arrays 3 are disposed in such a manner as to allow radiation of laser beams in the direction of a width W of a part 1 to be processed, that the laser diode arrays 3 are controlled so as to shape laser beams 2 in such a manner as to allow the laser beams 2 to be emitted in the direction of the width W of the part 1 to be processed, and that the laser beams 2 thus shaped are displaced in the longitudinal direction of the part 1 to be processed while being radiated. Furthermore, this method is designed such that the part 1 to be processed is irradiated with the shaped laser beams 2 while the laser diode arrays 3 are controlled in such a manner as to change the distribution of energy in accordance with the position in the width direction of the part 1 to be processed. Especially in the case of padding or the like, outputs from the laser diode arrays 3 are controlled and the distribution of energy is changed such that intensities 2R, 2L of laser beams with which the part 1 to be processed is irradiated in its width (W)-wise marginal portions 1R, 1L become higher than an intensity 2C of laser beams with which the part 1 to be processed is irradiated in its width (W)-wise central portion 1C. It is to be noted that the part to be processed in this embodiment is a cladding material 1 that has been deposited linearly on the surface of a base material 5. By irradiating the cladding material 1 with the laser beams 2, a cladding layer 1' welded to the surface of the base material 5 is formed.

Figure 12:
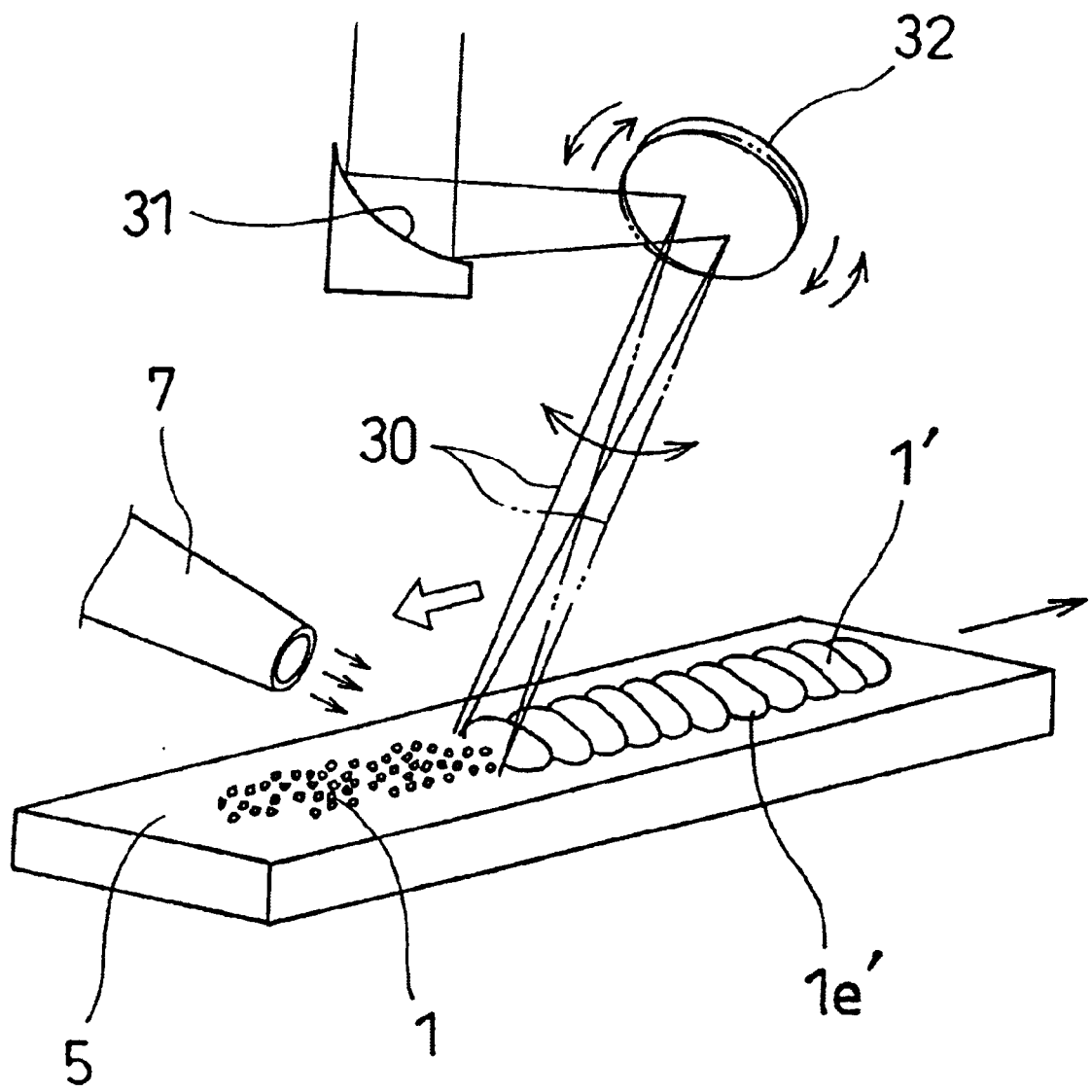
FIG. 12 is an explanatory view of a conventional laser beam machining device in which laser beams are oscillated.

First of all, the construction of a laser beam machining device that is employed to implement the method of the present invention will be described. The laser beam machining device employed in the present invention comprises a laser beam source 6 and a control means (not shown). The laser beam source 6 is composed of the laser diode arrays 3 that are disposed such that laser beams can be radiated in the direction of the width W of the part 1 to be processed. The control means controls the laser diode arrays 3 such that the laser beams 2 that have been shaped in accordance with the direction of the width W of the part 1 to be processed can be radiated. In the case where padding is performed to form the cladding layer 1', the laser beam machining device of this embodiment comprises a nozzle (not shown) for supplying the part 1 to be processed with the powdery cladding material 1 making the cladding layer 1' and a nozzle 7 (see FIG. 12) for supplying the surroundings of the cladding material 1 to be irradiated with the laser beams 2 with shielding gas. For example, if an intake or exhaust valve body of an engine or its valve seat portion is subjected to padding in this embodiment, powder of an alloy composed of such materials as can enhance wear resistance and corrosion resistance when the cladding material 1 is welded to the valve body or the valve seat portion is used as the cladding material 1.

Figure 2:
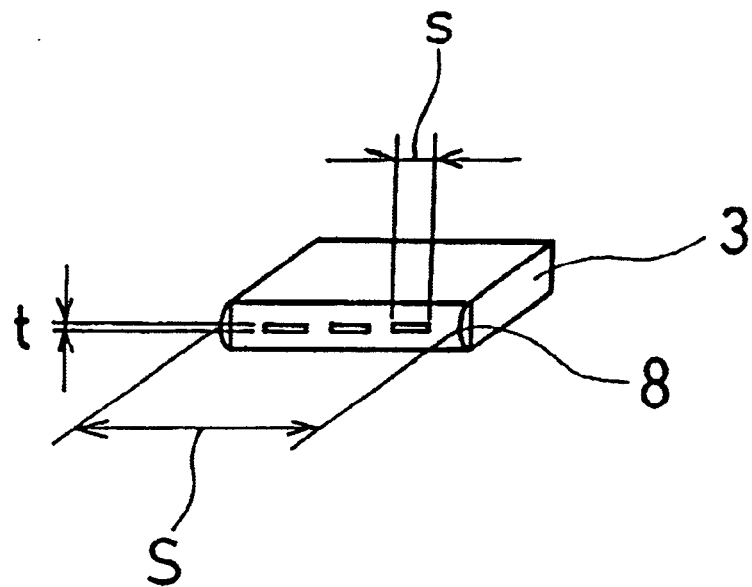
FIG. 2 is a perspective view of a laser diode array.
Figure 3:
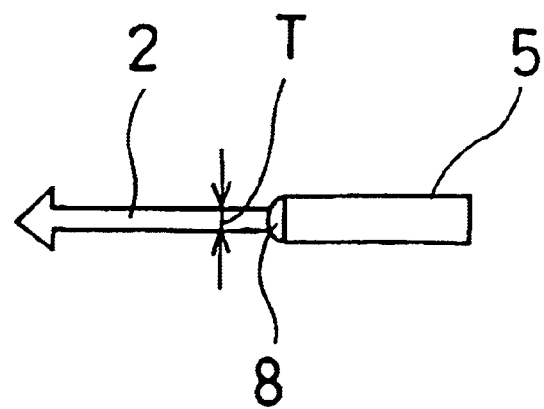
FIG. 3 is an explanatory view showing how parallel laser beams are radiated by a microlens provided in the laser diode array.

The laser diode arrays 3 is made, for example, from gallium arsenide semiconductor laser devices. The electric current supplied to each of the laser diode arrays 3 is controlled, whereby the intensity of beams radiated therefrom can be adjusted. As shown in FIGS. 2 and 3, a plurality of laser emission ports 3a are provided on one face of each of the laser diode arrays 3. In addition, a microlens 8 is secured to the face where the laser emission ports 3a are provided. For example, laser beams having a length s of about 100 $\mu$m and a width t of about 1.0 $\mu$m are emitted from each of the laser emission ports 3a. Because the microlens 8 is provided in front of the laser emission ports 3a, parallel laser beams having a length S of about 1 cm and a width T of about 1 mm can be radiated. Unlike the laser beams adapted for multiple mode as described in the description of the background art, the laser beams 2 can be radiated while their energy is distributed in a clearly stepped manner, and can be stabilized at a certain level as shown in FIG. 1 and the like.

In this embodiment, as shown in FIG. 1, the laser diode arrays 3 thus constructed are disposed above the cladding material 1 in the direction of the width W, thus constituting the laser beam source 6. A control device (not shown) is connected to each of the laser diode arrays 3, which is supplied with an electric current that has been controlled so as to allow radiation of laser beams having a predetermined output. The laser beam source 6 is set such that the laser beams 2 having a total output of, for example, about 4 kw can be radiated when the supplied electric current is controlled so as to assume 100%. A condensing lens 9 is interposed between the laser beam source 6 and the cladding material 1. Distances among the laser beam source 6, the condensing lens 9 and the cladding material 1, that is, focal distances can be adjusted relatively at need. The number of the laser diode arrays 3 disposed in the direction of the width W of the cladding material 1 that has been disposed linearly is set such that the width of the laser beams 2 with which the cladding material 1 is irradiated becomes at least equal to or greater than the width W of the cladding material 1 that has been deposited linearly. In the embodiment shown in the drawings, the laser diode arrays 3 are disposed such that the width of the laser beams 2 with which the cladding material 1 is irradiated becomes equal to the width W of the cladding material 1 that has been deposited linearly (see the laser diode arrays 3 indicated by solid lines in FIG. 1). It is also possible to dispose the laser diode arrays 3 such that the laser beams 2 having a width equal to or greater than the width W of the cladding material 1 can be radiated (see laser diode arrays 3' indicated by alternate long and two short dashes lines in FIG. 1), to provide a construction in which electric power is supplied only to a required number of the laser diodes 3 in accordance with the width W of the cladding material 1, and to thereby achieve general-purpose properties that make it possible to deal with the part 1 to be processed with a variable width.

When padding is performed according to the method of laser beam machining of the present invention using the laser beam machining device constructed as described above, the cladding material 1 having the predetermined width W is supplied linearly from the nozzle (not shown), and the laser beams 2 that have been shaped by the control device (not shown) in accordance with the direction of the width W of the cladding material 1 are radiated and displaced relative to the cladding material 1 in the longitudinal direction thereof. It is to be noted herein that the cladding material 1 that has been deposited linearly is thick in its width (W)-wise central portion and thin in its width (W)-wise marginal portions.

It is to be noted herein that the laser diode arrays 3 disposed in the direction of the width W of the cladding material 1 as shown in FIG. 1 are classified into a group 3C for irradiation of the width (W)-wise central portion of the cladding material 1 with laser beams having an output 2C and groups 3R, 3L for irradiation of the width (W)-wise marginal portions of the cladding material 1 with laser beams having outputs 2R, 2L. The control device (not shown) performs control such that the electric current supplied to the laser diode arrays 3 of the group 3C for irradiation of the width (W)-wise central portion 1C of the cladding material 1 becomes lower than the current supplied to the laser diode arrays 3 of the groups 3R, 3L for irradiation of the width (W)-wise marginal portions 1R, 1L of the cladding material 1. For example, the control device (not shown) performs control such that the output from the laser diode arrays 3 of the group C for irradiation of the width (W)-wise central portion 1C of the cladding material 1 assumes 50% and that the output from the laser diode arrays 3 of the groups 3R, 3L for irradiation of the width (W)-wise marginal portions 1R, 1L of the cladding material 1 assumes 90%. Thus, as shown in FIG. 1, the cladding material 1 is irradiated such that beams with which the cladding material 1 is irradiated in its width (W)-wise central portion 1C exhibit a low (weak) intensity 2C and that beams with which the cladding material 1 is irradiated in its width (W)-wise marginal portions 1R, 1L exhibit high (strong) intensities 2R, 2L respectively. The width (W)-wise central portion 1C of the cladding material 1 has been deposited to a great thickness and can be processed easily, whereas the width (W)-wise marginal portions 1R, 1L of the cladding material 1 have been deposited to a small thickness and cannot be processed easily. That is, the shaping of the laser beams 2 in the direction of the width W of the part 1 to be processed according to the present invention is synonymous with the shaping of the laser beams 2 not only in such a manner as to perform control for allowing radiation of the laser beams 2 having a width substantially equal to the width W of the part 1 to be processed but also in such a manner as to allow radiation of laser beams having suitable intensities in the direction of the width W of the part 1 to be processed, namely, in such a manner as to allow the part 1 to be processed to be heated with suitable distribution of heat input. As a result, as shown in FIG. 6(b) as the present invention, the cladding material 1 is heated substantially uniformly in the direction of the width W thereof and is welded to the surface of the base material 5 without being diluted, so that the smooth cladding layer 1' is formed. On the other hand, as shown in FIG. 6(b) as the comparative example that is distinct from the present invention, if the laser beams 2 having a uniform intensity are radiated from the laser diode arrays 3 in the direction of the width of the cladding material 1, the width (W)-wise central portion 1C of the cladding material 1 is heated excessively and diluted with the base material 5, and the width (W)-wise marginal portions 1R, 1L of the cladding material 1 are heated insufficiently and cannot be welded sufficiently as in the case of the background art. Also, the cladding layer 1' is formed such that its apex is bulgy and biased toward a location which has been heated excessively and to which a great amount of heat is inputted.

If the cladding material 1 is welded annularly to the base material 5 such as a valve body or a valve seat portion, the laser beams 2 are relatively displaced in the circumferential (longitudinal) direction while being radiated in the radial (width) direction. In this case, the radially inside marginal portion (1R or 1L) of the cladding material 1 and the radially outside marginal portion (1L or 1R) of the cladding material 1 are different from each other in circumferential speed during displacement in the circumferential direction. Therefore, if the laser beams 2 having a uniform intensity are radiated, the radially inside and outside marginal portions of the cladding material 1 are also different from each other in distribution of heat input. In such a case, control is performed such that the beams with which the radially inside marginal portion (1R or 1L) is irradiated exhibit a higher (stronger) intensity than the beams with which the radially outside marginal portion (1L or 1R) is irradiated. For example, it is possible to perform control such that the output from the laser diode arrays 3 of the group 3R for irradiation of the cladding material 1 in its radially outside one 1R of the marginal portions assumes 90% and that the output from the laser diode arrays 3 of the group 3L for irradiation of the cladding material 1 in its radially inside one 1L of the marginal portions assumes 70%. Alternatively, it is also possible to perform control such that the output from the laser diode arrays 3 of the group 3L for irradiation of the cladding material 1 in its radially inside one 1L of the marginal portions assumes 50% just like the output from the laser diode arrays 3 of the group 3C for irradiation of the cladding material 1 in its central portion.

Figure 4:
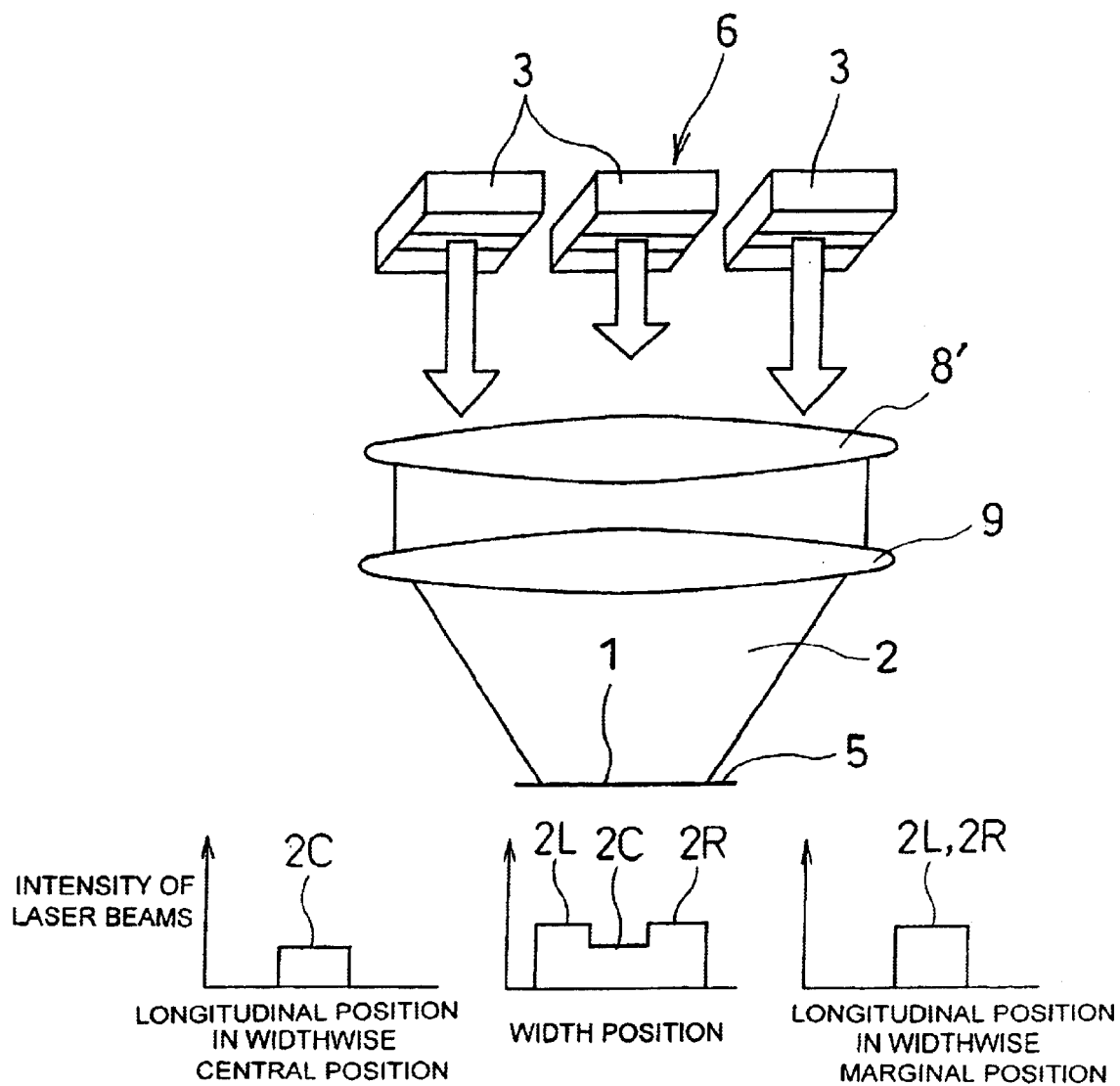
FIG. 4 is an explanatory view showing another embodiment of the present invention.

Further, the method of laser beam machining according to the present invention should not be limited to cases where the laser beam machining device constructed as described above is employed. For example, as shown in FIG. 4, the laser beam machining device can be constructed such that a collimation lens 8' is provided instead of the microlens 8 in front of the emission ports 3a of the laser diode arrays 3, that the collimation lens 8' converts the laser beams 2 emitted from the emission ports 3a of the laser diode arrays 3 into the parallel laser beams 2, and that the cladding material 1 that has been supplied to the surface of the base material 5 is then irradiated via the condensing lens 9 with the laser beams 2 that have been controlled so as to exhibit a predetermined intensity.

Figure 5:
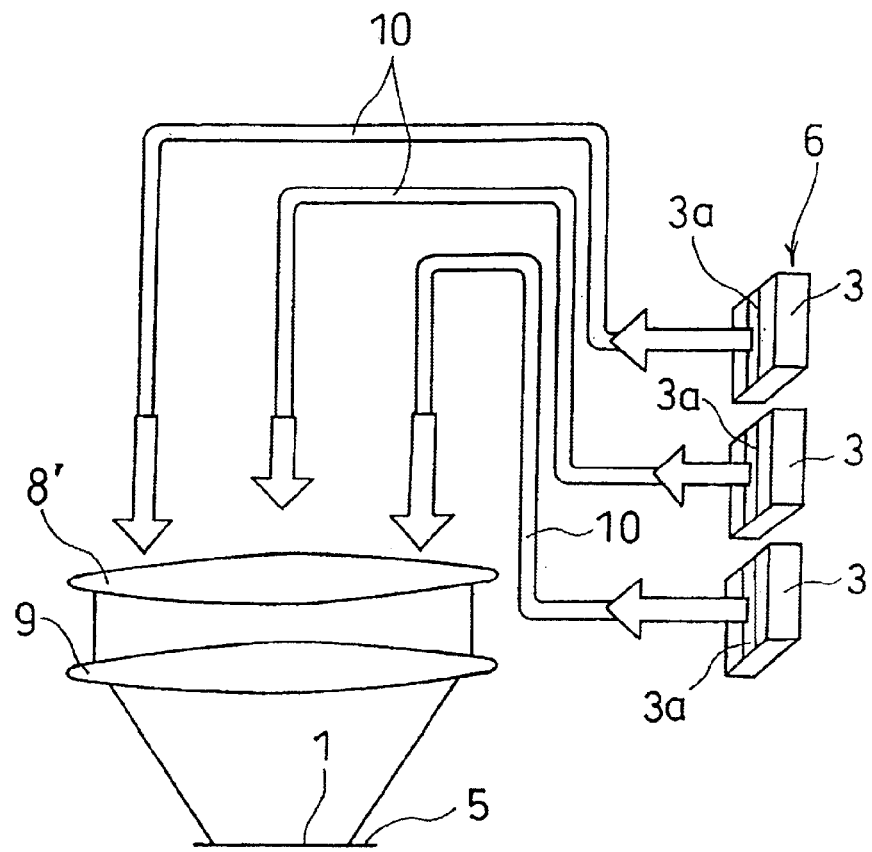
FIG. 5 is an explanatory view showing still another embodiment of the present invention.
Figure 5:
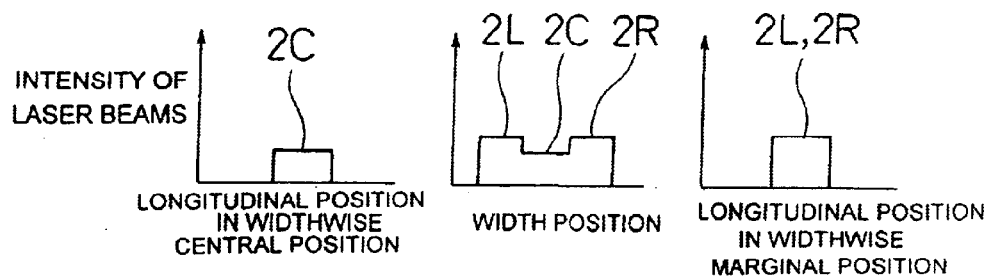
Figure 6:
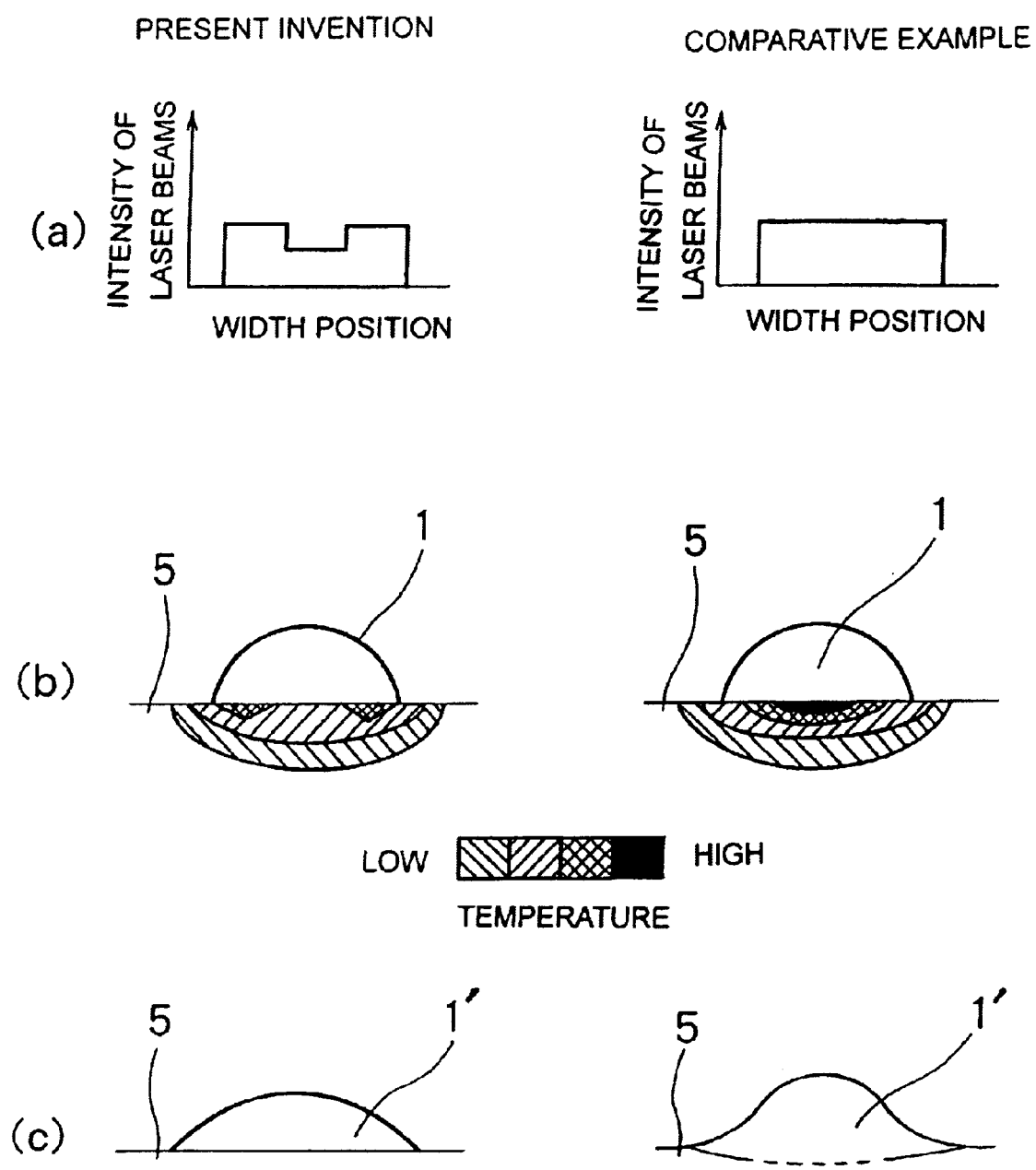
FIG. 6 is an explanatory view showing in a contrastive manner (a) a relation between intensities of laser beams and positions in the width direction, (b) distribution of temperatures in a base material, and (c) shape of a cladding layer that has been formed, as to the case of the present invention in which laser beams are radiated with variable distribution of energy and to a comparative example in which laser beams are radiated with invariable distribution of energy.

Furthermore, as shown in FIG. 5, the laser beam machining device can be constructed, for example, such that each of transmission fiber cables 10 is connected to a corresponding one of the emission ports 3a of the laser diode arrays 3 and that the cladding material 1 that has been supplied to the surface of the base material 5 is irradiated via the collimation lens 8' and the condensing lens 9 with the laser beams 2 that have been controlled so as to exhibit a predetermined intensity. In this case, the laser beam source 6 constructed by arranging the laser diode arrays 3 does not need to be disposed above the cladding material 1 and in parallel with the direction of the width W of the cladding material 1. Thus, the degree of freedom in designing the laser beam machining device is increased.

The method of laser beam machining according to the present invention should not be limited to the embodiment in which padding is performed as described above, and is also applicable to laser beam machining of other types such as laser beam welding and laser beam hardening. In this case, it is not indispensable to perform shaping so as to radiate the laser beams 2 such that the outputs 2R, 2L for the part 1 to be processed in its width (W)-wise marginal portions 1R, 1L become higher than the output 2C for the part 1 to be processed in its width (W)-wise central portion 1C. That is, it is also possible to perform shaping so as to radiate the laser beams 2 such that the output 2C for the width (W)-wise central portion 1C becomes higher than the outputs 2R, 2L for the width (W)-wise marginal portions 1R, 1L.

Hereinafter, embodiments of the present invention in which laser beam welding (FIGS. 7 to 9) and laser beam hardening (FIGS. 10 and 11) are performed will be described. It is to be noted in the following description that elements identical with or corresponding to those in the aforementioned case of padding are denoted by the same reference symbols and will not be described again.

Figure 7:
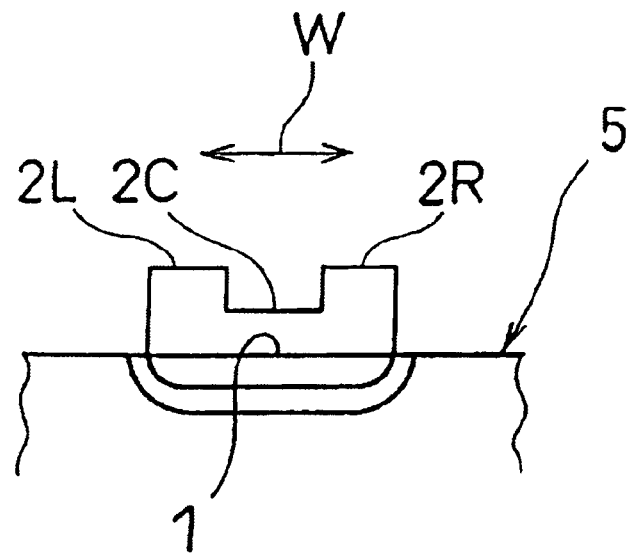
FIG. 7 is an explanatory view showing one embodiment of the present invention in which laser beams are radiated with variable distribution of energy in the case where a work having a uniform thickness is hardened.
Figure 8:
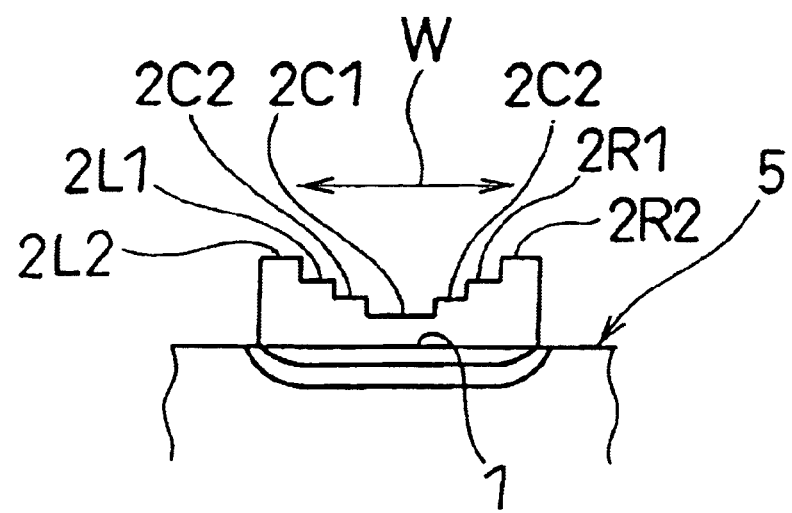
FIG. 8 is an explanatory view showing another embodiment of the present invention in which laser beams are radiated with variable distribution of energy in the case where a work having a uniform thickness is hardened.
Figure 9:
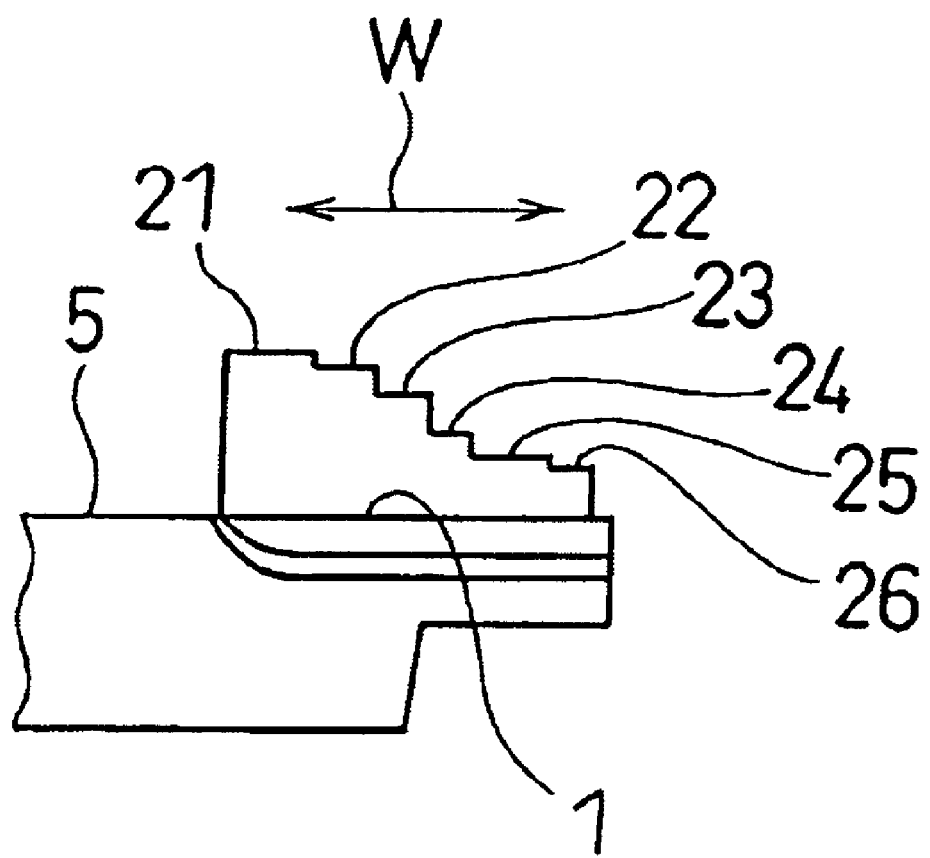
FIG. 9 is an explanatory view showing another embodiment of the present invention in which laser beams are radiated with variable distribution of energy in the case where a work having different thicknesses is hardened.

FIGS. 7 to 9 show a case where a work 5 is hardened in its part 1 to be processed which has a predetermined width.

These drawings schematically show the distribution of the energy of laser beams to be radiated is depicted above the surface of the part 1 to be processed and the distribution of the heat input resulting from the laser beams is depicted below the surface of the part 1 to be processed. As for the former, the output of the laser beams at each width (W) position is represented by a height corresponding to the intensity of the laser beams. As for the latter, each of substantially isothermal areas is represented by a line.

FIG. 7 shows a case where the laser beams with which the work 5 is irradiated in the part 1 to be processed are shaped and radiated according to three output groups for the widthwise central portion 2C and the widthwise marginal portions 2R, 2L. In this embodiment, the work 5 to be hardened has a uniform plate thickness or a uniform wall thickness.

It is to be noted herein that the heat inputted to both the marginal portions of the part 1 to be processed generally tends to be lower than the heat inputted to the central portion of the part 1 to be processed if the laser beams are radiated in the direction of the width W with uniform distribution of energy. Hence, if laser beams are radiated so as to harden the part 1 to be processed in both the marginal portions thereof at a predetermined temperature, the amount of heat inputted to the central portion of the part 1 to be processed may become excessive to the extent of causing penetration.

However, in the case of the method according to this embodiment of the present invention, the electric current to be supplied to each of the laser diode arrays 3 is controlled and set such that the output 2C of the laser beams for the central portion of the part 1 to be processed becomes lower (weaker) than the outputs 2R, 2L of the laser beams for both the marginal portions of the part 1 to be processed. Thus, heat is inputted uniformly to the work 5 in the part 1 to be processed, so that the work 5 is hardened uniformly without causing a problem of penetration or the like.

In the case where the work 5 having a uniform thickness is hardened, the method of the present invention should not be limited to the aforementioned embodiment in which the laser beams are shaped according to three groups. For example, as shown in FIG. 8, the electric current to be supplied to each of the laser diode arrays 3 may be controlled and set such that the laser beams are shaped and radiated according to even more groups 2C1, 2C2, 2R1 or 2L1, and 2R2 or 2L2 or the like so as to increase the output gradually from the widthwise central portion toward the widthwise marginal portions.

FIG. 9 shows a case of the embodiment in which the work 5 having different thicknesses is hardened in the part 1 to be processed. The electric current to be supplied to each of the laser diode arrays 3 is controlled and set in such a manner as to achieve uniform distribution of heat input, whereby laser beams with which the part 1 to be processed is irradiated are shaped such that their outputs 21 to 26 are gradually lowered in a direction from the thicker side to the thinner side. Thus, even the work 5 having different thicknesses can be hardened uniformly without causing a problem of penetration or the like.

Figure 10:
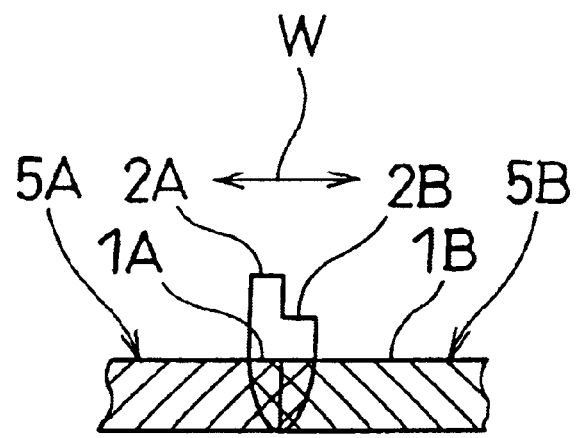
FIG. 10 is an explanatory view showing one embodiment of the present invention in which laser beams are radiated with variable distribution of energy in the case where a work having a uniform thickness and a variable speed of weld penetration is butt-welded.
Figure 11:
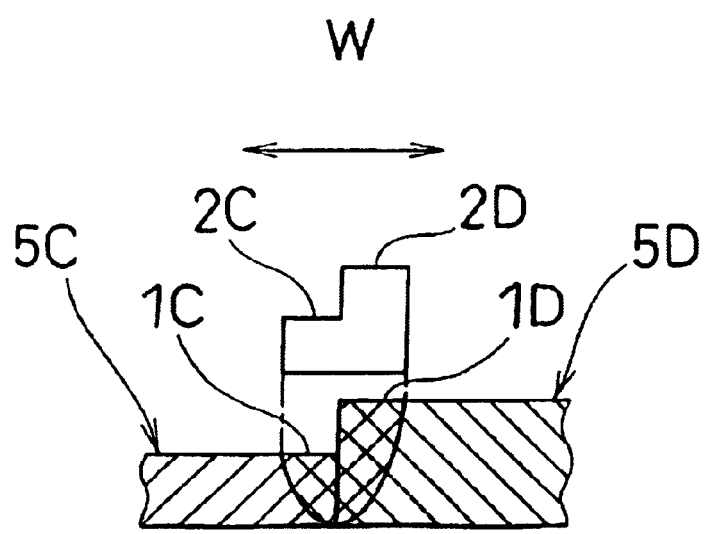
FIG. 11 is an explanatory view showing one embodiment of the present invention in which laser beams are radiated with variable distribution of energy in the case where a work having different thicknesses and a uniform speed of weld penetration is butt-welded.

FIGS. 10 and 11 show a case where works 5A, 5B are butt-welded and a case where works 5C, 5D are butt-welded, respectively. Each of these drawings shows the distribution of the energy of laser beams to be radiated is depicted above the surfaces of connecting ends 1A, 1B or 1C, 1D of both the works and the distribution of the degree of penetration resulting from the laser beams is depicted below the surfaces of the connecting ends 1A, 1B or 1C, 1D of both the works. As for the former, each of the outputs 2A, 2B or 2C, 2D of the laser beams with which a corresponding width (W) position is irradiated is represented by a height corresponding to the intensity of the laser beams. As for the latter, those regions of the works 5A, 5B or 5C, 5D which have been fused by being irradiated with the laser beams are represented.

Although the works 5A, 5B shown in FIG. 10 are substantially equal in thickness, they are made from materials that are different in speed of weld penetration (depth of weld penetration). For example, one of the works 5A is made from iron, and the other work 5B is made from aluminum.

In general, if works made from different materials are irradiated with laser beams of the same output, the speed of weld penetration of the work made from aluminum is higher than that of the work made from iron. Hence, if the work 5A made from iron and the work 5B made from aluminum are butted against each other and welded to each other by being irradiated with laser beams of the same output, incomplete welding such as insufficient fusion of the work 5A or meltdown of the work 5B is caused.

However, in the case of the method according to the embodiment of the present invention shown in FIG. 10, the electric current to be supplied to each of the laser diode arrays 3 is controlled and set so as to shape the laser beams such that the output 2B of the laser beams with which the work 5B is irradiated at its connecting end 1B becomes lower (weaker) than the output 2A of the laser beams with which the work 5A is irradiated at its connecting end 1A. Thus, the connecting end 1A of the work 5A and the connecting end 1B of the work 5B are melt to a substantially equal depth at a substantially equal speed, and are connected to each other without causing incomplete welding.

The works 5C, 5D shown in FIG. 11 are equal in speed of weld penetration, for example, because they are made from the same material. However, the works 5C, 5D are different in thickness. That is, one of the works 5C is thinner than the other work 5D.

In general, if works made from the same material and having different thicknesses are irradiated with laser beams of the same output, the speed of weld penetration in the thicker one of the works is lower than the speed of weld penetration in the thinner one of the works. Hence, if the thinner work 5C and the thicker work 5D, which are made from the same material, are butted against each other and welded to each other by being irradiated with laser beams of the same output, incomplete welding such as meltdown of the thinner work 5C and insufficient fusion of the thicker work 5D is caused.

However, in the case of the method according to the embodiment of the present invention shown in FIG. 11, the electric current to be supplied to each of the laser diode arrays 3 is controlled and set so as to shape the laser beams such that the output 2C of the laser beams with which the work 5C is irradiated at its connecting end 1C becomes lower (weaker) than the output 2D of the laser beams with which the work 5D is irradiated at its connecting end 1D. Thus, the connecting end 1C of the work 5C and the connecting end 1D of the work 5D are suitably melt to a substantially equal depth at a substantially equal speed, and are connected to each other without causing incomplete welding.

In order to shape laser beams in accordance with the direction of the width W of the part to be processed, the present invention may be designed not only to control the electric current to be supplied to each of the laser diode arrays but also to additionally employ other means (not shown) such as an integration mirror and the like.

Further, the present invention may employ a plurality of laser diode arrays that are stacked via insulating materials (spacers).

INDUSTRIAL APPLICABILITY

The present invention as set forth in claim 1 can provide a method of laser beam machining which is capable of suitably processing a part to be processed by means of laser beams, on the basis of a simple construction wherein a plurality of laser diode arrays are disposed so as to allow radiation of laser beams in the direction of the width of the part to be processed and wherein each of the laser diode arrays is controlled in accordance with the direction of the width of the part to be processed so that laser beams are shaped and that the part to be processed is irradiated with the laser beams.

The present invention as set forth in claim 2 is based on the present invention as set forth in claim 1 and designed such that each of the laser diode arrays is controlled and laser beams are shaped so as to change the distribution of energy in accordance with the width position of the part to be processed and to thereby irradiate the part to be processed with the laser beams with suitable distribution of energy. Thus, the present invention as set forth in claim 2 can provide a method of laser beam machining which is capable of suitably processing a part to be processed.

The present invention as set forth in claim 3 is based on the present invention as set forth in claim 2 and designed such that the distribution of energy is changed by controlling each of the laser diode arrays and shaping the laser beams such that laser beams with which the part to be processed is irradiated in its widthwise marginal portions exhibit a higher intensity than laser beams with which the part to be processed is irradiated in its widthwise central portion. Thus, the present invention as set forth in claim 3 can provide a method of laser beam machining which is capable of uniformly and suitably processing a part to be processed in its widthwise marginal portions that cannot be processed easily and in its widthwise central portion that can be processed easily.

The present invention as set forth in claim 4 is based on the present invention as set forth in any one of claims 1 to 3 and can provide a method of laser beam machining which is capable of optimally performing a processing that has been selected from padding, welding and hardening.

What is claimed is:

1. A method of laser beam machining: comprising the steps of:

disposing a plurality of laser diode arrays in a direction of a width of a part to be processed in such a manner as to allow radiation of laser beams in the direction of the width of a part to be processed, and controlling each of the laser diode arrays and shaping the laser beams such that laser beams in which the part to be processed is irradiated in its widthwise marginal portions exhibit a higher intensity than laser beams with which the part to be processed is irradiated in its widthwise central portion.

2. The method of laser beam machining according to claim 1, wherein laser beam machining is a processing which is selected from padding, welding and hardening and to which the part to be processed is subjected.

3. The method of laser beam machining according to claim 1, wherein shaping the laser beams includes distributing an intensity of the laser beams in a stepwise manner along a width of the part to be processed.

* * * * *